(12) United States Patent
Yeh

(10) Patent No.: US 11,805,601 B2
(45) Date of Patent: Oct. 31, 2023

(54) LOAD CONTROL DEVICE AND HAND-ASSEMBLY CIRCUIT BOARD

(71) Applicant: AIDMICS BIOTECHNOLOGY (HK) CO., LIMITED, Wanchai (HK)

(72) Inventor: Chang-Ching Yeh, Wanchai (HK)

(73) Assignee: AIDMICS BIOTECHNOLOGY (HK) CO., LIMITED, Wanchai (HK)

( * ) Notice: Subject to any disclaimer, the term of this patent is extended or adjusted under 35 U.S.C. 154(b) by 322 days.

(21) Appl. No.: 17/169,163

(22) Filed: Feb. 5, 2021

(65) Prior Publication Data

US 2021/0251076 A1 Aug. 12, 2021

(30) Foreign Application Priority Data

Feb. 6, 2020 (TW) ................................. 109103723

(51) Int. Cl.
| | |
|---|---|
| *H05B 45/30* | (2020.01) |
| *H05K 1/11* | (2006.01) |
| *H05K 1/18* | (2006.01) |
| *H05B 45/3725* | (2020.01) |

(52) U.S. Cl.
CPC ........... *H05K 1/11* (2013.01); *H05B 45/3725* (2020.01); *H05K 1/181* (2013.01); *H05B 45/30* (2020.01); *H05K 2201/10106* (2013.01); *H05K 2201/10166* (2013.01)

(58) Field of Classification Search
CPC ...... H05B 45/30; H05B 45/44; H05B 45/375; H05B 45/3725; H05K 1/11; H05K 1/14; H05K 1/181; H05K 1/189
See application file for complete search history.

(56) References Cited

U.S. PATENT DOCUMENTS

| | | | | |
|---|---|---|---|---|
| 11,019,696 | B2 * | 5/2021 | Sun | H05B 45/395 |
| 2012/0133293 | A1 * | 5/2012 | Shin | H05B 45/44 |
| | | | | 315/200 R |
| 2017/0192508 | A1 * | 7/2017 | Lim | G06F 3/04166 |
| 2017/0371363 | A1 * | 12/2017 | Habu | G05F 3/26 |
| 2018/0184490 | A1 * | 6/2018 | Ido | H05B 45/44 |
| 2018/0324913 | A1 * | 11/2018 | Deng | H02M 1/15 |
| 2020/0107417 | A1 * | 4/2020 | Zhuang | H05B 45/36 |

* cited by examiner

*Primary Examiner* — Tung X Le
(74) *Attorney, Agent, or Firm* — MUNCY, GEISSLER, OLDS & LOWE, P.C.

(57) ABSTRACT

A load control device for controlling a load unit includes a transistor circuit, a charge/charge-discharge circuit, a first hand-assembly electrode and a second hand-assembly electrode. The transistor circuit includes a transistor, and a first electrode of the transistor is electrically connected to one end of the load unit. The charge/charge-discharge circuit is electrically connected to a control electrode and a second electrode of the transistor. The first hand-assembly electrode is electrically connected to the control electrode of the transistor. The second hand-assembly electrode is electrically connected to the charge/charge-discharge circuit and the second electrode of the transistor. A hand-assembly circuit board including the load control device and a hand-assembly circuit is also provided.

20 Claims, 12 Drawing Sheets

LOAD CONTROL DEVICE AND HAND-ASSEMBLY CIRCUIT BOARD

CROSS REFERENCE TO RELATED APPLICATIONS

This Non-provisional application claims priority under 35 U.S.C. § 119(a) on Patent Application No(s). 109103723 filed in Taiwan, Republic of China on Feb. 6, 2020, the entire contents of which are hereby incorporated by reference.

BACKGROUND

Technology Field

The present disclosure relates to a control device and, in particular, to a load control device and a hand-assembly circuit board.

Description of Related Art

The main function of a circuit board is to provide electrical connections between various components and circuits on the circuit board, and different components or circuits can be connected to achieve different functions according to different control requirements. Take the dimming circuit of a light-emitting diode (LED) as an example, the common LED dimming circuit is to provide power to drive the LED and control the LED current by pulse width modulation (PWM). However, the dimming method of controlling the current flowing through the LED by PWM needs a very complicated control circuit, and the cost thereof is relatively high. It is difficult for non-professional technical personnel to implement or apply this dimming method.

SUMMARY

An objective of this disclosure is to provide a load control device and a hand-assembly circuit board that have the advantages of simple circuit, easy manufacturing, low cost, and wide application field.

Another objective of this disclosure is to provide a load control device and a hand-assembly circuit board that can derive various operation modes base on the conductivity (resistance value) of the medium for conducting the open switch.

To achieve the above, the present disclosure discloses a hand-assembly circuit board, which comprises a load control device and a hand-assembly circuit. The load control device comprises a transistor circuit, a charge/charge-discharge circuit, a first hand-assembly electrode, and a second hand-assembly electrode. The transistor circuit comprises a transistor. The charge/charge-discharge circuit is electrically connected to a control electrode and a second electrode of the transistor. The first hand-assembly electrode is electrically connected to the control electrode of the transistor, and the second hand-assembly electrode is electrically connected to the charge/charge-discharge circuit and the second electrode of the transistor. The hand-assembly circuit is electrically connected to the load control device.

To achieve the above, the present disclosure discloses a load control device for controlling a load unit. The load control device comprises a transistor circuit, a charge/charge-discharge circuit, a first hand-assembly electrode and a second hand-assembly electrode. The transistor circuit comprises a transistor, and a first electrode of the transistor is electrically connected to one end of the load unit. The charge/charge-discharge circuit is electrically connected to a control electrode and a second electrode of the transistor. The first hand-assembly electrode is electrically connected to the control electrode of the transistor. The second hand-assembly electrode is electrically connected to the charge/charge-discharge circuit and the second electrode of the transistor.

In one embodiment, a surface area of the first hand-assembly electrode and/or the second hand-assembly electrode is greater than or equal to 15 mm$^2$.

In one embodiment, the load control device further comprises a third hand-assembly electrode, the hand-assembly circuit comprises a load unit, and one end of the load unit is electrically connected to a first electrode of the transistor through the third hand-assembly electrode.

In one embodiment, the hand-assembly circuit board further comprises a substrate, and the hand-assembly circuit is disposed on the substrate.

In one embodiment, the load control device is disposed on the substrate.

In one embodiment, the hand-assembly circuit is electrically connected to the load control device through a conductive ink, a conductive adhesive, a conductive tape, or a conductive paper.

In one embodiment, the load control device further comprises a fourth hand-assembly electrode and a power source unit, the fourth hand-assembly electrode is disposed adjacent to the first hand-assembly electrode, a positive electrode of the power source unit is electrically connected to the fourth hand-assembly electrode and another end of the load unit, and a negative electrode of the power source unit is electrically connected to the second hand-assembly electrode.

In one embodiment, a fourth hand-assembly electrode is disposed adjacent to the first hand-assembly electrode, the fourth hand-assembly electrode is electrically connected to a positive electrode of a power source unit, and the second hand-assembly electrode is electrically connected to a negative electrode of the power source unit.

In one embodiment, the hand-assembly circuit is electrically connected to the first hand-assembly electrode, the second hand-assembly electrode, the third hand-assembly electrode, or the fourth hand-assembly electrode.

In one embodiment, a plurality of marks are disposed around the first hand-assembly electrode, the second hand-assembly electrode, the third hand-assembly electrode, or the fourth hand-assembly electrode.

In one embodiment, the first hand-assembly electrode or the second hand-assembly electrode is circular or polygonal.

In one embodiment, the charge/charge-discharge circuit is a charge circuit comprising a capacitor.

In one embodiment, the charge/charge-discharge circuit is a charge-discharge circuit comprising a capacitor and a resistor, which are connected in parallel.

In one embodiment, the first hand-assembly electrode, the second hand-assembly electrode or the third hand-assembly electrode is a flat conductive body or a 3D conductive body.

In one embodiment, the fourth hand-assembly electrode is a flat conductive body or a 3D conductive body.

As mentioned above, the load control device and hand-assembly circuit board of this disclosure have the advantages of simple circuit, easy manufacturing, low cost, and wide application field. In addition, the load control device and hand-assembly circuit board of this disclosure can derive various operation modes base on the conductivity (resistance value) of the medium for conducting the open switch.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
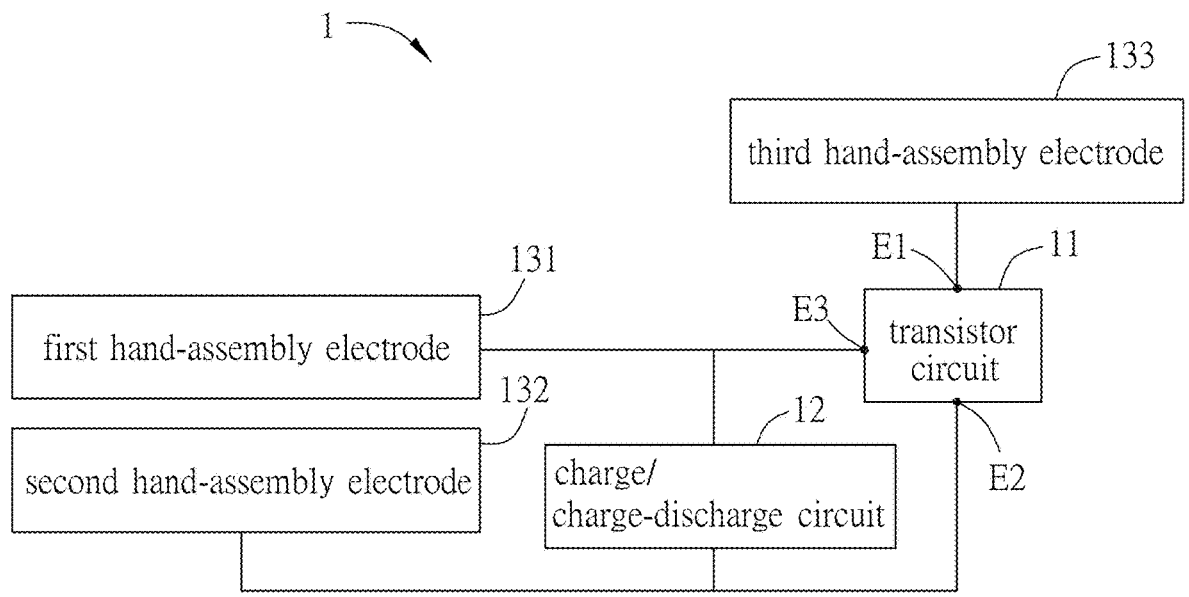
FIG. 1A is a schematic diagram showing a load control device according to an embodiment of this disclosure.

FIG. 1A is a schematic diagram showing a load control device 1 according to an embodiment of this disclosure. As shown in FIG. 1A, the load control device 1 comprises a transistor circuit 11, a charge/charge-discharge circuit 12, a first hand-assembly electrode 131, and a second hand-assembly electrode 132. In addition, the load control device 1 of this embodiment further comprises a third hand-assembly electrode 133.

The transistor circuit 11 comprises at least one transistor, and each transistor comprises a first electrode E1, a second electrode E2, and a control electrode E3. The first electrode E1 of the transistor is electrically connected to the third hand-assembly electrode 133. Two ends of the charge/charge-discharge circuit 12 are electrically connected to the control electrode E3 and the second electrode E2 of the transistor, respectively.

The first hand-assembly electrode 131 is electrically connected to the control electrode E3 of the transistor. The second hand-assembly electrode 132 is disposed adjacent to the first hand-assembly electrode 131, and the second hand-assembly electrode 132 is electrically connected to the charge/charge-discharge circuit 12 and the second electrode E2 of the transistor. To be noted, the hand-assembly electrode can be operated or used by the hand of a user, and can cooperate with other components and/or wires to form a circuit or loop. In general, the hand-assembly electrode has a certain surface area. For example, the surface area of the first hand-assembly electrode 131, and/or the second hand-assembly electrode 132, and/or the third hand-assembly electrode 133 is greater than or equal to 15 mm$^2$, so that the user (or bare hand of the user) can function as an electrode or a conductive body for steadily electrically connecting to, for example, the electrodes of the transistor, thereby electrically connecting the other components, units or circuits. In brief, the hand-assembly electrode is provided for the user to operate or assemble by hand, so that the hand-assembly electrode can be an electrode or conductive body electrically connected to other components or wires. In the application of striped hand conductive tape, since the surface area of the first hand-assembly electrode 131, and/or the second hand-assembly electrode 132, and the third hand-assembly electrode 133 is greater than or equal to 15 mm$^2$, the user can easily attach the hand conductive tape on the surface of the first hand-assembly electrode 131, the second hand-assembly electrode 132, and the third hand-assembly electrode 133. In this case, the contact area between the conductive tape and the hand-assembly electrode(s) is large, so the conductivity can be sufficiently increased.

Figure 1B:
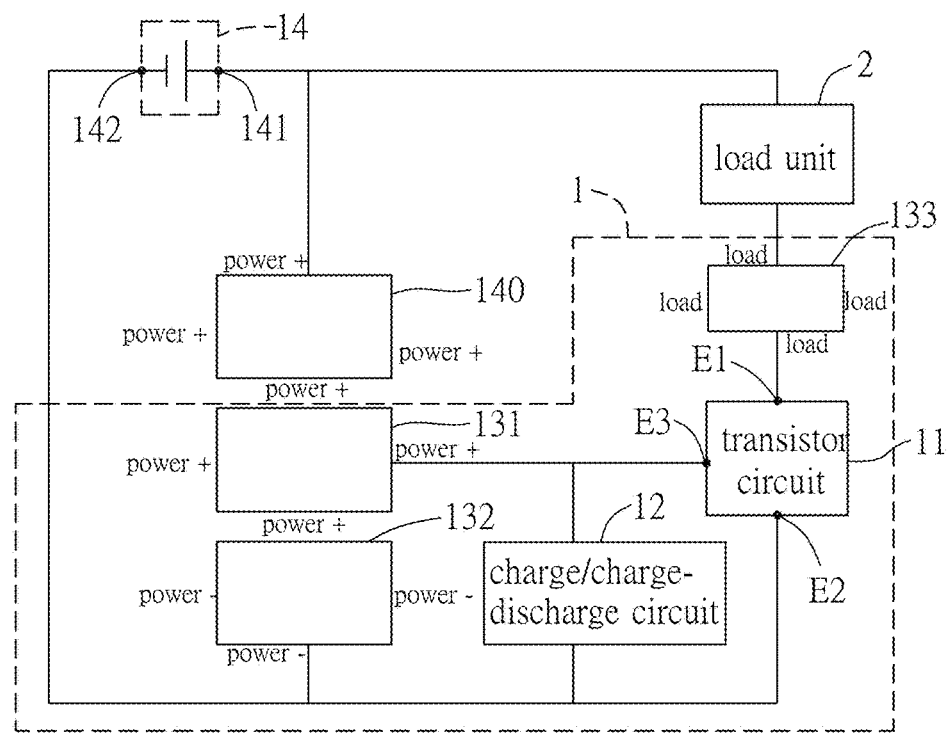
FIGS. 1B to 1D are schematic diagrams showing different application aspects of the load control device according to the embodiment of this disclosure.
Figure 1C:
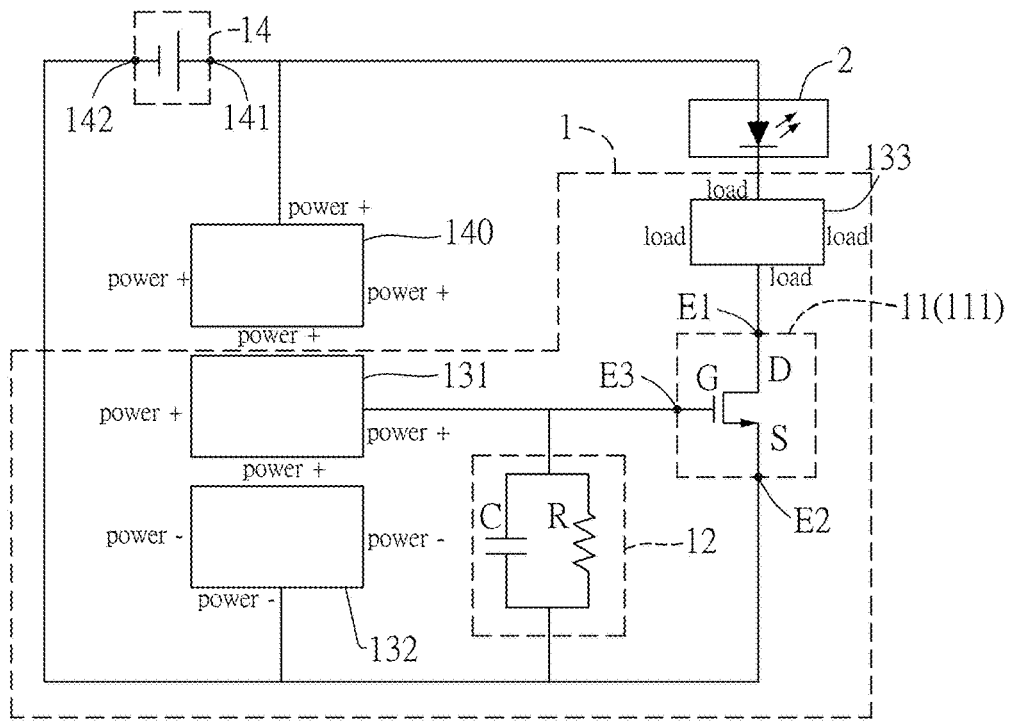
Figure 1D:
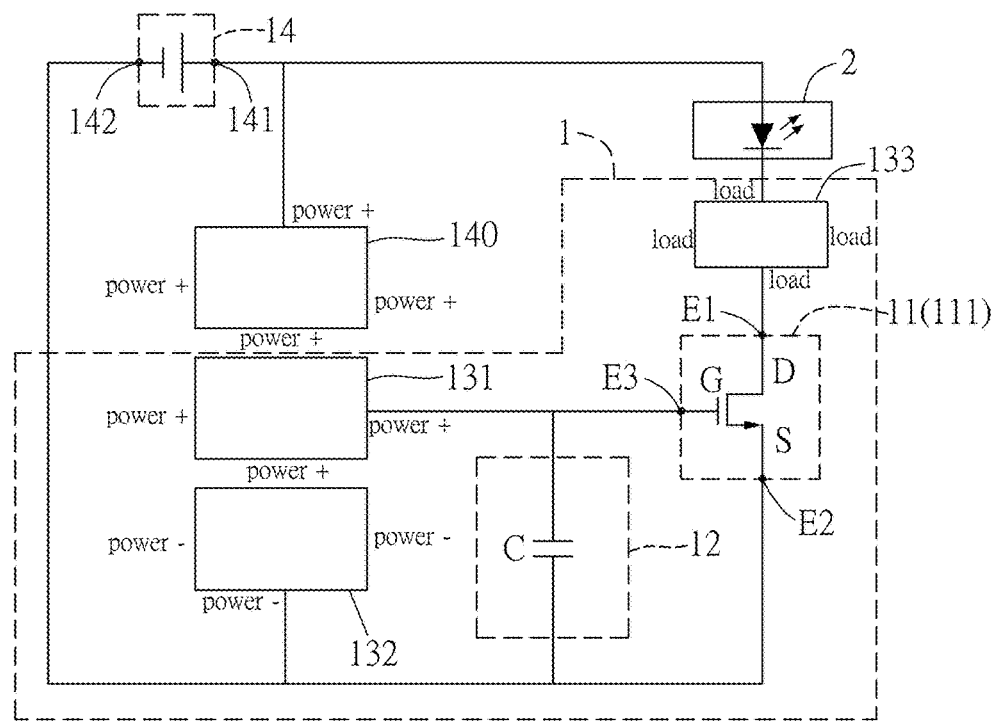
Figure 2A:
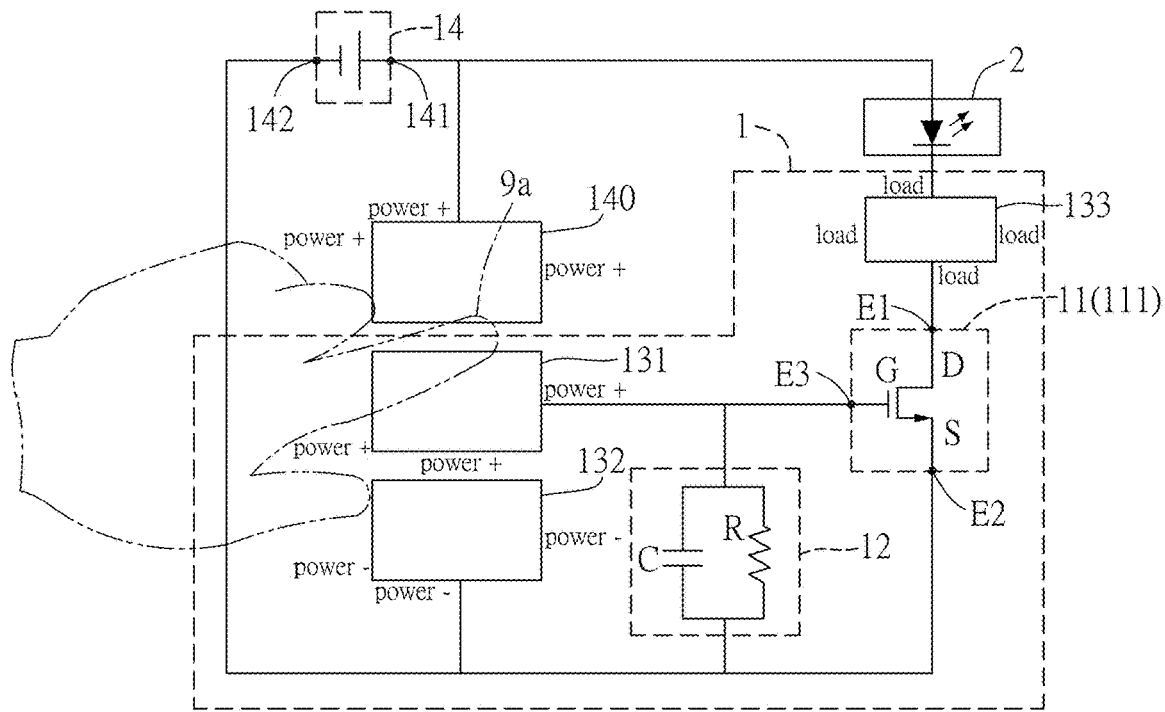
FIGS. 2A and 2B are schematic diagrams showing different triggering methods of the load control device according to the embodiment of this disclosure.
Figure 2B:
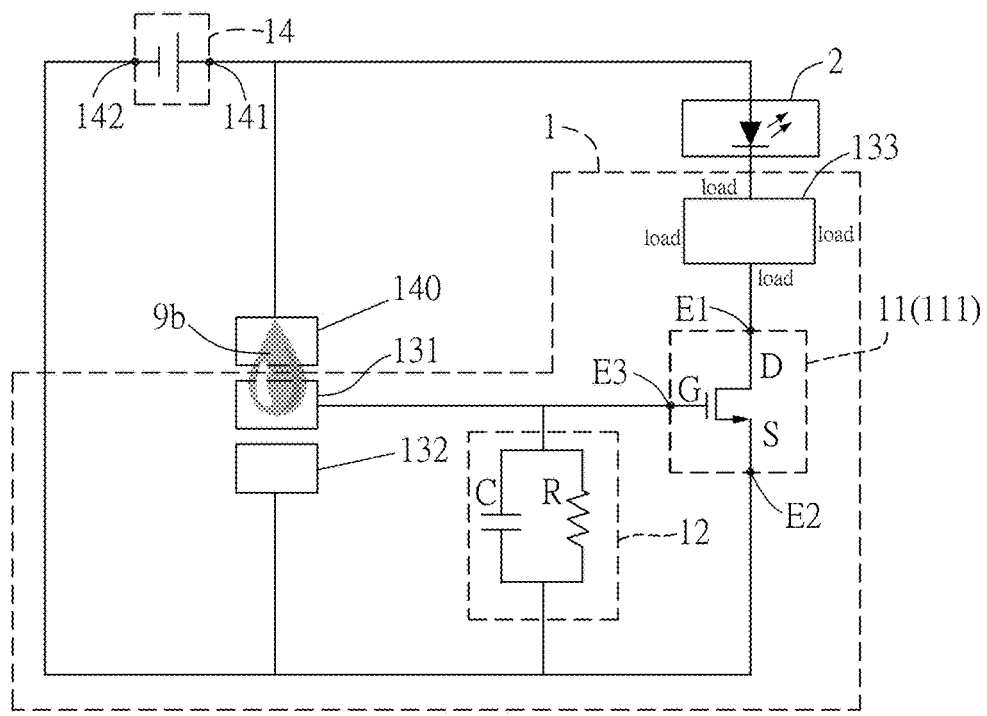
Figure 2C:
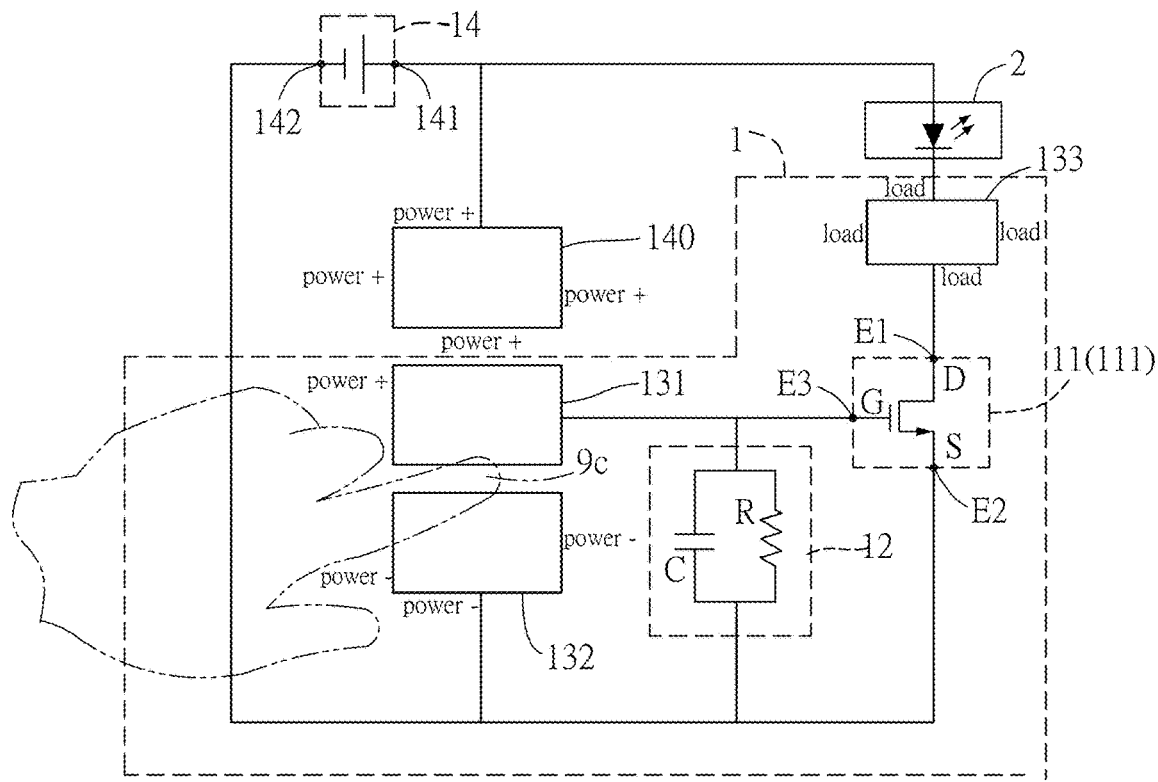
FIGS. 2C and 2D are schematic diagrams showing different applications of the load control device according to the embodiment of this disclosure.
Figure 2D:
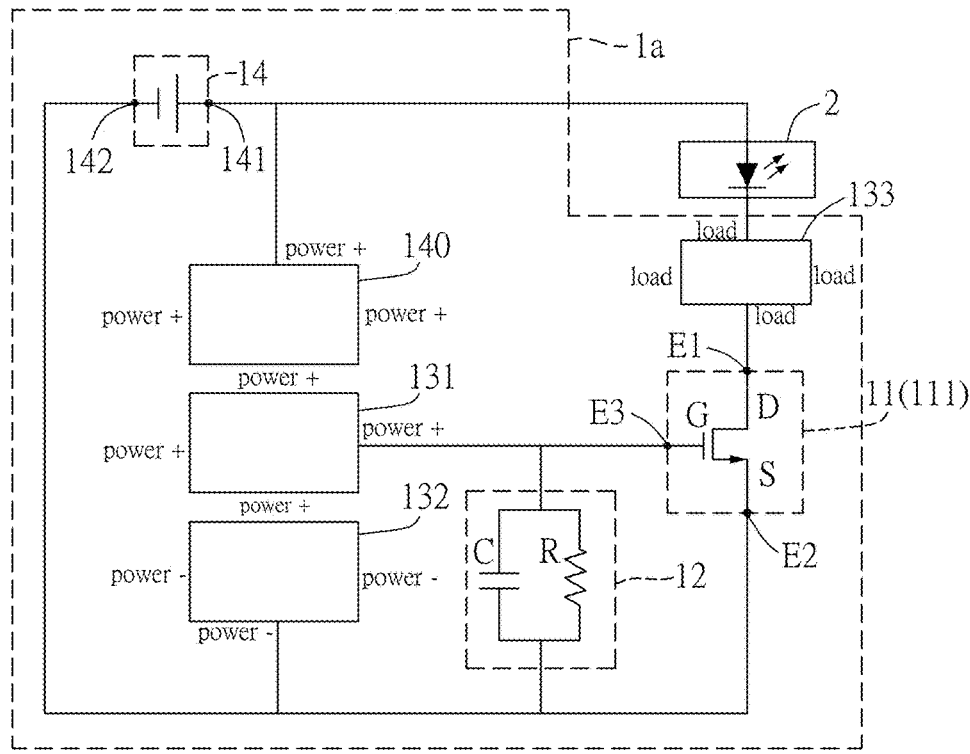

The applications of the load control device 1 of this disclosure will be describe hereinafter with reference to the following drawings. FIGS. 1B to 1D are schematic diagrams showing different application aspects of the load control device 1 according to the embodiment of this disclosure, FIGS. 2A and 2B are schematic diagrams showing different triggering methods of the load control device 1 according to the embodiment of this disclosure, and FIGS. 2C and 2D are schematic diagrams showing different applications of the load control device 1 according to the embodiment of this disclosure.

Referring to FIGS. 1B and 1C, the load control device 1 of this embodiment is applied to control at least one load unit 2. The load control device 1 comprises a transistor circuit 11, a charge/charge-discharge circuit 12, a first hand-assembly electrode 131, and a second hand-assembly electrode 132. In addition, the load control device 1 further comprises a third hand-assembly electrode 133.

The load control device 1 can be a hand-assembly circuit, and the user can connect the components, units or circuit, such as the transistor circuit 11, the charge/charge-discharge circuit 12, the first hand-assembly electrode 131, the second hand-assembly electrode 132, and the third hand-assembly electrode 133, by the hand-assembly method based on the control requirement, thereby forming the control circuit for controlling the load unit 2. In this embodiment, the load unit 2 can include, for example but not limited to, an electro-variable element. Accordingly, when the load control device 1 applies a control current to the load unit 2, the load unit 2 can be controlled to generate, for example, light, heat, sound, color variation, motion (rotation and/or movement), magnet, or any combination thereof. The load unit 2 may comprise at least one of a light-emitting element, a heating element, a sound element, an electrochromic element, a motor machine, a magnetic element, or any combination thereof. In practice, the load unit 2 can, for example but not limited to, an LED, an OLED, an electric heater, a speaker or buzzer, an electrochromic glass or sheet, a motor, a linear transmission elements, an electromagnet, or any combinations thereof, or any of other electronic units, components or circuits that can be varied or changed after applying current. This disclosure is not limited. As shown in FIG. 1C, the load unit 2 of this embodiment is an LED as an example. In some embodiments, the load unit 2 may comprise a plurality of LED circuits, which are connected in series and/or in parallel, or other electrovariable elements depending on the circuit design requirement. In some embodiments, when the load unit 2 comprises a plurality of LEDs, which are connected in series, the load control device 1 can control to turn on/off the multiple LEDs simultaneously. In other embodiments, when the load unit 2 comprises a plurality of LEDs, which are connected in parallel, the load control device 1 can control to turn on/off the multiple LEDs sequentially.

The transistor circuit 11 comprises a transistor 111. The transistor 111 is a three-terminal element, which has three connecting electrodes (or connecting terminals). In this embodiment, the first electrode E1 of the transistor 11 is electrically connected to one end of the load unit 2 (e.g. the negative electrode of the LED) through the third hand-assembly electrode 133. The transistor 111 can be a bipolar junction transistor (BJT), a field effect transistor (FET), or an insulated gate bipolar transistor (IGBT). The field effect transistor includes a junction field effect transistor (JFET) or a metal-oxide-semiconductor field-effect transistor (MOSFET). In this embodiment, the transistor 111 is, for example, an N-type MOSFET. Thus, the control electrode E3 of the transistor 111 is the gate G of the MOSFET, the first electrode E1 thereof is the drain D of the MOSFET, and the second electrode E2 thereof is the source S of the MOSFET. In another embodiment, the control electrode E3 of the transistor 111 is the gate G of the MOSFET, the first electrode E1 thereof is the source S of the MOSFET, and the second electrode E2 thereof is the drain D of the MOSFET.

In different embodiments, when the transistor 111 is a BJT, the control electrode E3 of the transistor 111 is the base (B) of the BJT, the first electrode E1 thereof is the collector (C) of the BJT, and the second electrode E2 thereof is the emitter (E) of the BJT. Alternatively, the control electrode E3 of the transistor 111 can be the base (B) of the BJT, the first electrode E1 thereof can be the emitter (E) of the BJT, and the second electrode E2 thereof can be the collector (C) of the BJT. In different embodiments, when the transistor 111 is an IGBT, the control electrode E3 of the transistor 111 is the gate G of the IGBT, the first electrode E1 thereof is the collector (C) of the IGBT, and the second electrode E2 thereof is the emitter (E) of the IGBT. Alternatively, the control electrode E3 of the transistor 111 can be the gate G of the IGBT, the first electrode E1 thereof can be the emitter (E) of the IGBT, and the second electrode E2 thereof is the collector (C) of the IGBT. The skilled person in the art should understand the three electrodes of different types of transistors, so the detailed descriptions thereof will be omitted.

Two ends of the charge/charge-discharge circuit 12 are electrically connected to the control electrode E3 and the second electrode E2 of the transistor 111. As shown in FIG. 1C, the charge/charge-discharge circuit 12 is a charge-discharge circuit (12), which comprises a capacitor C and a resistor R connected in parallel. In addition, the first hand-assembly electrode 131 is electrically connected to the control electrode E3 of the transistor 111, and the second hand-assembly electrode 132 is electrically connected to the charge-discharge circuit 12 and the second electrode E2 of the transistor 111. In this embodiment, one end of the charge-discharge circuit 12 (R and C) is electrically connected to the first hand-assembly electrode 131 and the control electrode E3 (gate G) of the transistor 111, and the other end of the charge-discharge circuit 12 is electrically connected to the second electrode E2 (source S) of the transistor 111 and the second hand-assembly electrode 132.

The skilled person in the art knows that the capacitor C is an electric storage element, and the RC parallel circuit has a time constant $\tau$ ($\tau = R*C$). This value $\tau$ determines the change rate of the electricity quantity of the capacitor C. The larger the time constant $\tau$, the slower the electricity change, and the longer the charging and discharging time. On the contrary, the smaller the time constant $\tau$, the faster the electricity change, and the shorter the charging and discharging time. In other words, the function of the charge-discharge circuit 12 of this embodiment is similar to a timer, which controls the charging and/or discharging time by controlling the capacitance and/or resistance thereof, thereby controlling the operation and/or stop time of the load unit 2. For example, the charge-discharge circuit 12 can control the On/Off time of the LED(s). In a different embodiment, as shown in FIG. 1D, the charge/charge-discharge circuit 12 can also be a charge circuit (12), which comprises a capacitor C only.

In this embodiment, the surface area of the first hand-assembly electrode 131, and/or the second hand-assembly electrode 132, and/or the third hand-assembly electrode 133 is greater than or equal to 15 mm$^2$ and is less than or equal to 100 mm$^2$. According to this design, the user can easily attach, for example, the striped hand conductive tape to the surface of the first hand-assembly electrode 131, the second hand-assembly electrode 132, or the third hand-assembly electrode 133. Besides, since the contact area therebetween is large, the conductivity can be sufficiently increased. Moreover, this embodiment can prevent the large surface area of the first hand-assembly electrode 131, the second hand-assembly electrode 132, or the third hand-assembly electrode 133, which may occupy too many space in the load control device 1.

Referring to FIGS. 1B and 1C, in order to connect to the power source, a fourth hand-assembly electrode 140 can be disposed adjacent to the first hand-assembly electrode 131. In this embodiment, the fourth hand-assembly electrode 140 is electrically connected to the positive electrode of a power source unit 14, and the second hand-assembly electrode 132 is electrically connected to the negative electrode of the power source unit 14, the charge-discharge circuit 12, and the second electrode E2 of the transistor 111. Specifically, the positive electrode 141 of the power source unit 14 is electrically connected to the fourth hand-assembly electrode 140 and another end of the load unit 2 (i.e. the positive electrode of LED). In some embodiments, the power source unit 14 can be a battery such as, for example but not limited to, a button cell for matching the requirement of thin and light. In different embodiments, the power source unit 14 may comprise the AC power source (e.g. the utility power or wall power) or the AC power source and rectifier circuit for driving the load unit 2 (e.g. an AC load or a large power load) to work.

The first hand-assembly electrode 131, the second hand-assembly electrode 132 and the fourth hand-assembly electrode 140 can together form an open switch. Specifically, the open switch is a switch to be conducted (turned on) by using an object (or medium) to contact the first hand-assembly electrode 131 and the fourth hand-assembly electrode 140 simultaneously or to contact the first hand-assembly electrode 131 and the second hand-assembly electrode 132. The selected object or medium can be a tangible good conductor (e.g. metal, iron), an object with low resistance, or an object with high resistance (e.g. human hand). The conduction method in this disclosure is not limited, and the only limitation is that the object or medium for conducting the opening switch is not an insulator. In different application examples, the natural phenomena, such as wind or raindrops, can be used to conduct the open switch. For example, the first hand-assembly electrode 131 and/or the fourth hand-assembly electrode 140 can be blown by wind and then contact with each other, thereby conducting the first hand-assembly electrode 131 and the fourth hand-assembly electrode 140. Alternatively, when the raindrop contacts both of the first hand-assembly electrode 131 and the fourth hand-assembly electrode 140, the first hand-assembly electrode 131 and the fourth hand-assembly electrode 140 can be conducted.

The general conductor can be divided into the 1D structure, 2D structure and 3D structure. The 1D structural conductor can be a linear conductor, which has a length much larger than the sectional size thereof. The linear conductor can be, for example but not limited to, a wire for electrically connecting two units, a unit and a circuit, two circuit, or two elements. The 2D structural conductor can be realized as a flat conductor, which has a side surface much larger than the thickness thereof. The flat conductor can be, for example but not limited to, a connecting pad, a conductive tape, a conductive paper, a conductive sheet, or any combination thereof, or any 2D conductor with a flat shape and suitable for conducting. The 3D structural conductor can be realized as a solid conductor, which can be, for example but not limited to, a conductive ball, a conductive cylinder, a conductive corn, a conductive pyramid, or any combination thereof, or any 3D conductor with a solid structure and suitable for conducting. In this embodiment, the first hand-assembly electrode 131, the second hand-assembly electrode 132, the third hand-assembly electrode 133, and the fourth hand-assembly electrode 140 are flat conductors or solid conductors. When the first hand-assembly electrode 131, the second hand-assembly electrode 132, the third hand-assembly electrode 133, or the fourth hand-assembly electrode 140 is a flat conductor, the shape thereof can be a circle or a polygon (e.g. triangle, quadrilateral, pentagon, or the likes). In this embodiment, the first hand-assembly electrode 131, the second hand-assembly electrode 132, the third hand-assembly electrode 133, and the fourth hand-assembly electrode 140 are quadrilaterals for example.

To be noted, in the embodiment of FIGS. 1B and 1C, a plurality of marks can be configured around the first hand-assembly electrode 131, the second hand-assembly electrode 132, the third hand-assembly electrode 133, or the fourth hand-assembly electrode 140. In this embodiment, the marks can be, for example but not limited to, "power+", "power−", or "load". Wherein, "power+" represents the positive electrode of power source, "power−" represents the negative electrode of power source, and "load" represents the load (unit). According to these marks, the user can realize that the first hand-assembly electrode 131 and the fourth hand-assembly electrode 140 need to be electrically connected to the positive electrode 141 of the power source unit 14, and the second hand-assembly electrode 132 needs to be electrically connected to the negative electrode 142 of the power source unit 14, and the third hand-assembly electrode 133 needs to be electrically connected to the load unit 2. In practice, when the first hand-assembly electrode 131, the second hand-assembly electrode 132, the third hand-assembly electrode 133, or the fourth hand-assembly electrode 140 is electrically connected to other elements through the conductive tape, if one of the marks is blocked by the conductive tape, the user can still realize that the electrode needs to be electrically connected to which element based on the other uncovered marks as shown in FIG. 4C.

FIGS. 2A and 2B are schematic diagrams showing different conducting (triggering) methods of the open switch of the load control device 1 of FIG. 1C.

Referring to FIG. 2A, in the load control device 1 of this embodiment, each of the first hand-assembly electrode 131 and the fourth hand-assembly electrode 140 is, for example, a connecting pad or a conductive pad. When the finger 9a touches the first hand-assembly electrode 131 and the fourth hand-assembly electrode 140 of the open switch, since the finger 9a has high resistance, the current flowing through the first hand-assembly electrode 131, the finger 9a, and the fourth hand-assembly electrode 140 is relatively smaller. Accordingly, the charging time of the capacitor C of the charge-discharge circuit 12 is relatively longer (slow charging, wherein the charging time depends on the time constant). Since the voltage difference between two ends of the capacitor C does not reach the threshold voltage of the gate G of the transistor 111 immediately, the LED is not turned on yet. After charging for a while, when the voltage difference between two ends of the capacitor C is equal to or greater than the threshold voltage of the gate G of the transistor 111, the current applied from the power source unit 14 can flow through the LED (the load unit 2), thereby forming a loop via the transistor 111 and thus turning on the LED.

In addition, as shown in FIG. 2B, the open switch can also be conducted by a droplet 9b. In this embodiment, when the droplet 9b contacts the first hand-assembly electrode 131 and the fourth hand-assembly electrode 140 simultaneously, since the droplet 9b has low resistance, the current flowing through the first hand-assembly electrode 131, the droplet 9b, and the fourth hand-assembly electrode 140 is relatively larger. Accordingly, the charging time of the capacitor C is relatively shorter (fast charging). Since the voltage difference between two ends of the capacitor C can rapidly reach the threshold voltage of the gate G of the transistor 111, the current applied from the power source unit 14 can immediately flow through the LED and the transistor 111, thereby turning on the LED. Accordingly, this disclosure can conduct the open switch with the objects (or mediums) having different resistance values for controlling the delayed time to turn on the LED. In addition, the charging time of the charge-discharge circuit 12 can be controlled by the capacitance value and/or resistance value thereof, thereby controlling the conducting time of the load unit 2.

Furthermore, when the finger 9a or the droplet 9b leaves the open switch so as to turn off (cutoff) the first hand-assembly electrode 131 and the fourth hand-assembly electrode 140, the capacitor C starts to discharge, and the voltage difference between two ends of the capacitor C decreases. To be noted, the discharging time depends on the time constant. When the voltage difference between two ends of the capacitor C is smaller than the threshold voltage of the gate G, the transistor 111 will be cut off, and thus the LED is turned off. As a result, the load control device 1 of this embodiment utilizes simple circuit and components to achieve the dimming function of LED (the load unit 2), thereby achieving the advantages of simple circuit, easy manufacturing, low cost, and wide application field. In addition, the load control device 1 of this disclosure can derive various operation modes base on the conductivity (resistance value) of the medium for conducting the open switch.

In the above embodiment, the load control device 1 utilizes the natural discharge of the capacitor C to control the turn-off period of the LED. In other embodiments, the user may utilize other objects or media to shorten the turn-off period of the LED. Regarding the load control device 1 as shown in FIG. 2C, when the first hand-assembly electrode 131 and the fourth hand-assembly electrode 140 are conducted to turn on the LED, another object (e.g. the finger 9c or a metal conductor) can be applied to contact the first hand-assembly electrode 131 and the second hand-assembly electrode 132 for shortening the turn-off period of the LED. In more detailed, when another object is applied to contact the first hand-assembly electrode 131 and the second hand-assembly electrode 132, the capacitor C will be discharged through the first hand-assembly electrode 131, the applied object, and the second hand-assembly electrode 132. Thus, the voltage difference between two ends of the capacitor C can be lower than the threshold voltage of the gate G faster, thereby turning off the LED faster. The turn-off period of the LED is determined based on the resistance value of the applied object for contacting the first hand-assembly electrode 131 and the second hand-assembly electrode 132. When the resistance value of the applied object is smaller, the capacitor C can be discharged faster, and the LED can be turned off faster. When the resistance value of the applied object is larger (e.g. the finger), the capacitor C can be discharged slower, and the LED can be turned off slower. In addition, when the applied object is a good conductor (e.g. a metal conductor), the voltage difference between two ends of the capacitor C will become less than the threshold voltage of the gate G immediately, thereby turning off the LED immediately.

Therefore, in the load control device 1 of FIG. 2C, the user can control the resistance value of the object for conducting the first hand-assembly electrode 131 and the fourth hand-assembly electrode 140 so as to control the turn-on period of the LED, and control the resistance value of another object for conducting the first hand-assembly electrode 131 and the second hand-assembly electrode 132 so as to control the turn-off period of the LED. Alternatively, the user can control the capacitance value and/or the resistance value of the charge-discharge 12 so as to control the turn-on period and the turn-off period.

To be noted, the embodiments of FIGS. 2A and 2C can break through the existing restrictions by utilizing the finger. Since the finger has the features of conductive and large resistance value, this disclosure utilizes these features to control the charge and discharge procedures. Thus, this disclosure can achieve the control of charging and/or discharging without special materials or sophisticated tools. Of course, the load control device 1 of FIG. 1D can also be operated by finger or any of other external conductors for controlling the charging time and/or the discharging time of the charge circuit 12 (i.e. the capacitor C).

In addition, the component configurations and connections of the load control device 1a of this embodiment as shown in FIG. 2D are mostly the same as those of the previous embodiment. Different from the previous embodiment, the load control device 1a further comprises a fourth hand-assembly electrode 140 and a power source unit 14. In other words, the fourth hand-assembly electrode 140 and the power source unit 14 are the internal components of the load control device 1a.

FIGS. 3A to 3D are schematic diagrams showing different application situations of the load control device according to the embodiment of this disclosure. The application examples of FIGS. 3A to 3D can all utilize any of the load control devices 1 and 1a and the modifications thereof. To be noted, FIGS. 3A to 3D mainly show the aspect of the first hand-assembly electrode 131 and the fourth hand-assembly electrode 140 of the open switch, and the other units, circuits, loading unit, and/or power source unit of the load control device can be disposed, for example, inside the device body B of FIGS. 3A and 3B or other positions.

Figure 3A:
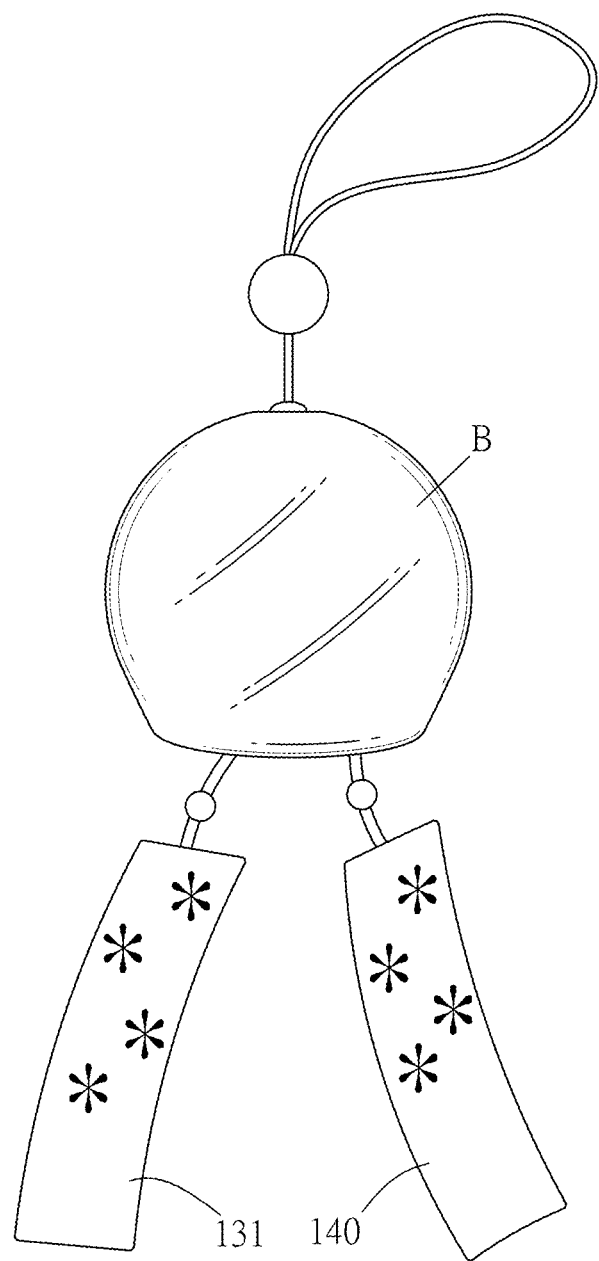
FIGS. 3A to 3D are schematic diagrams showing different application situations of the load control device according to the embodiment of this disclosure.

As shown in FIG. 3A, the above-mentioned load control device can be applied to, for example, a (Japanese style) wind bell. In this embodiment, the first hand-assembly electrode 131 and the fourth hand-assembly electrode 140 are flat conductors (e.g. 2D conductive sheets). When the two flat conductors of the wind bell (the first hand-assembly electrode 131 and the fourth hand-assembly electrode 140) are blown by wind and contact with each other, the load unit disposed inside the main body B (e.g. including a speaker and LED) can be initiated to output sound and/or light(s). In this aspect, the load unit disposed in the main body B can simulate the reaction of a real wind bell while the wind blows.

Figure 3B:
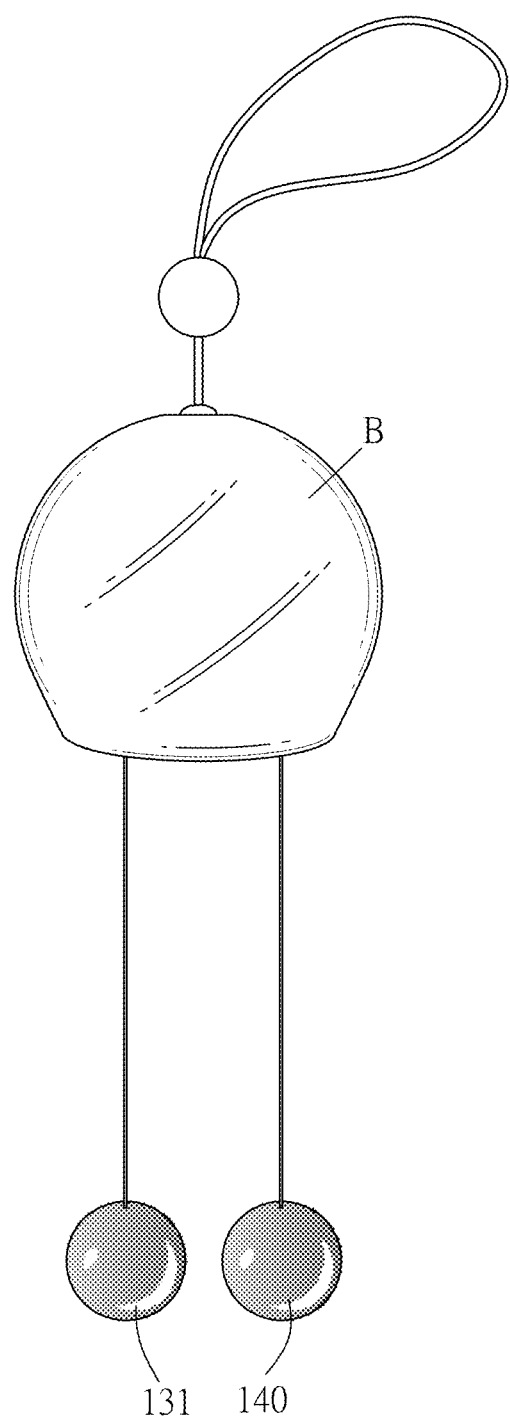

As shown in FIG. 3B, in this embodiment, the first hand-assembly electrode 131 and the fourth hand-assembly electrode 140 are 3D conductors, such as plastic balls covered with a conductive material or metal balls. When the two 3D conductors of the wind bell (the first hand-assembly electrode 131 and the fourth hand-assembly electrode 140) are blown by wind and contact with each other, the load unit disposed inside the main body B can be initiated to output sound and/or light(s) for simulating the reaction of a real wind bell.

Figure 3C:
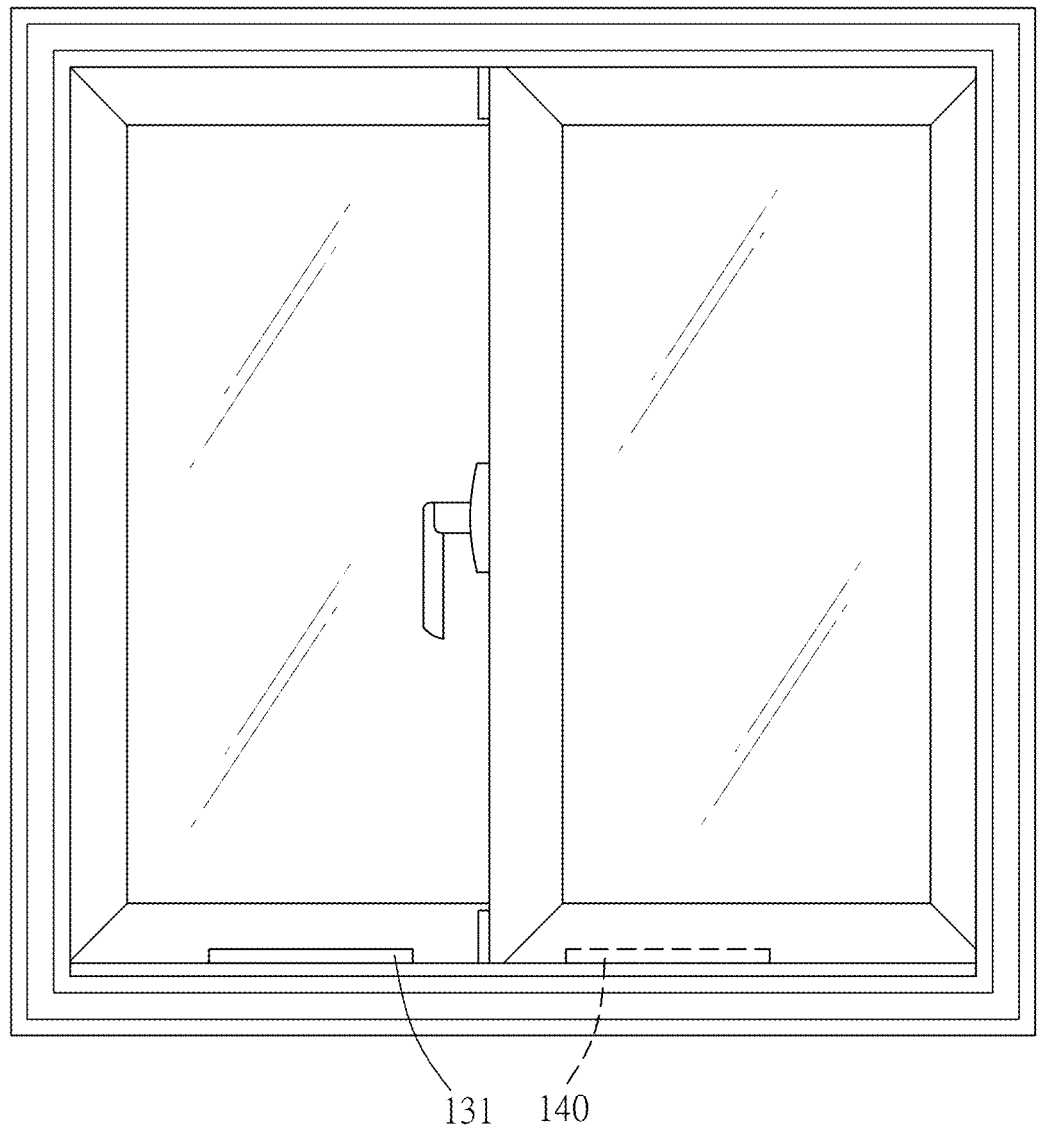

In addition, as shown in FIG. 3C, the above-mentioned load control device can be applied to, for example, a window for the anti-theft purpose. In this embodiment, the first hand-assembly electrode 131 and the fourth hand-assembly electrode 140 are flat conductors and are attached to two frames (or glasses). When one of the frame is opened, and the fourth hand-assembly electrode 140 on the moved frame contacts the first hand-assembly electrode 131 on the other frame, it may control the load unit to output sound and/or light, or to make an emergency call to notify the house owner, security or police, thereby achieving the anti-theft function.

Figure 3D:
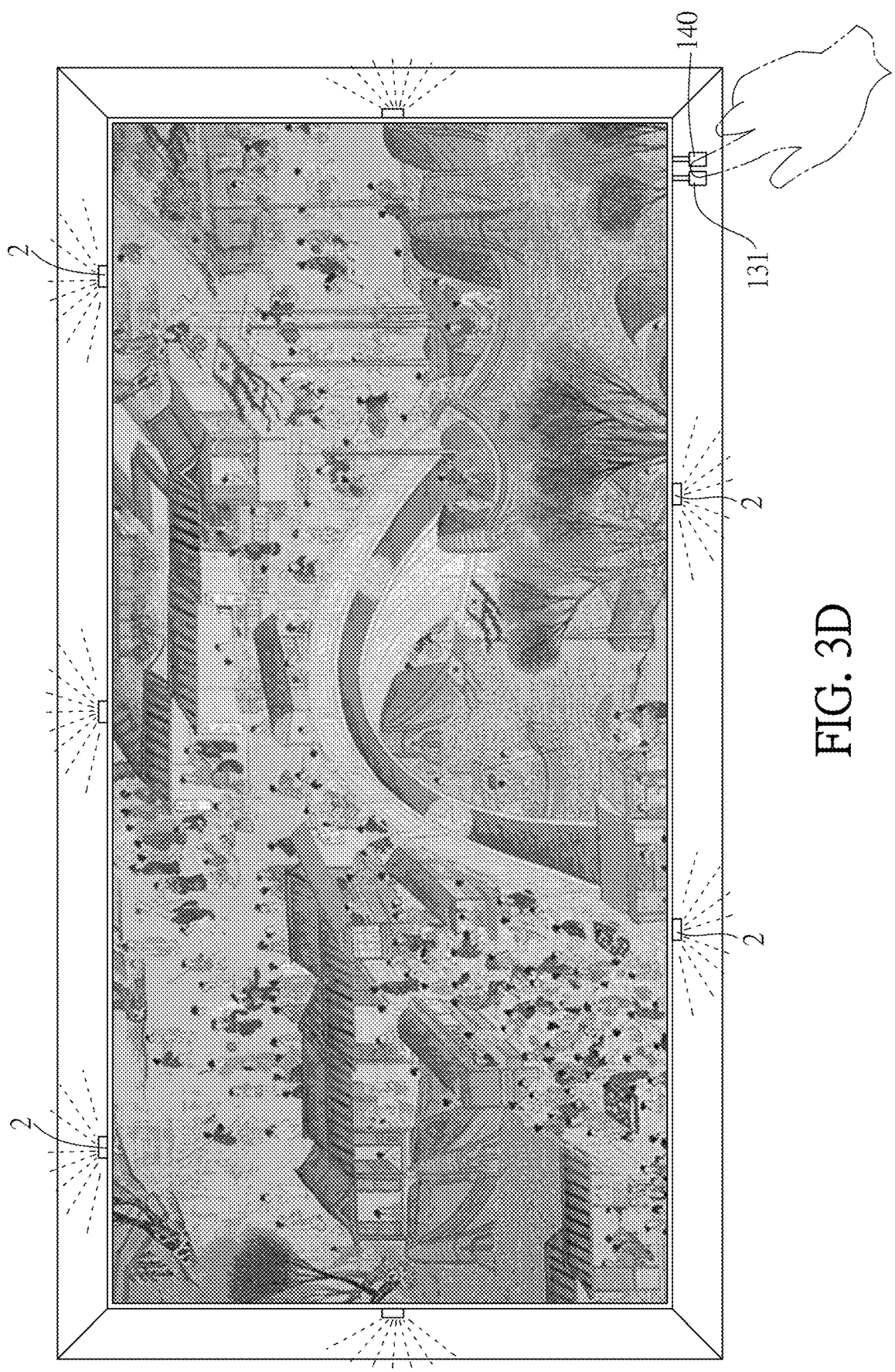

In addition, as shown in FIG. 3D, the above-mentioned load control device can also be applied to the illumination of, for example, paintings in art gallery. In this embodiment, the first hand-assembly electrode 131 and the fourth hand-assembly electrode 140 are flat conductors disposed aside the painting. When the visitor intends to view this painting, he/she can touch the first hand-assembly electrode 131 and the fourth hand-assembly electrode 140 by, for example, a finger, to conduct the open switch for outputting light and/or sound. For example, the outputted light can irradiate the entire painting or a specific area of the painting, or show the author's creation description, and the outputted sound can broadcast the author's creation description to the viewer.

The above-mentioned application situations are for illustrations only, and the designer can apply the load control device in different examples. For example, the load control device can be applied to an apparatus with a handlebar (the user can hold the handlebar to conduct the open switch), to detect wind (the wind can initiate the conduction of the open switch), or to detect rain (the raindrop can conduct the open switch), and this disclosure is not limited.

FIGS. 4A to 4D are schematic diagrams showing the hand-assembly circuit boards according to different embodiments of this disclosure. The hand-assembly circuit boards of this disclosure have the feature of hand assembling and are different from the general printed circuit board.

Figure 4A:
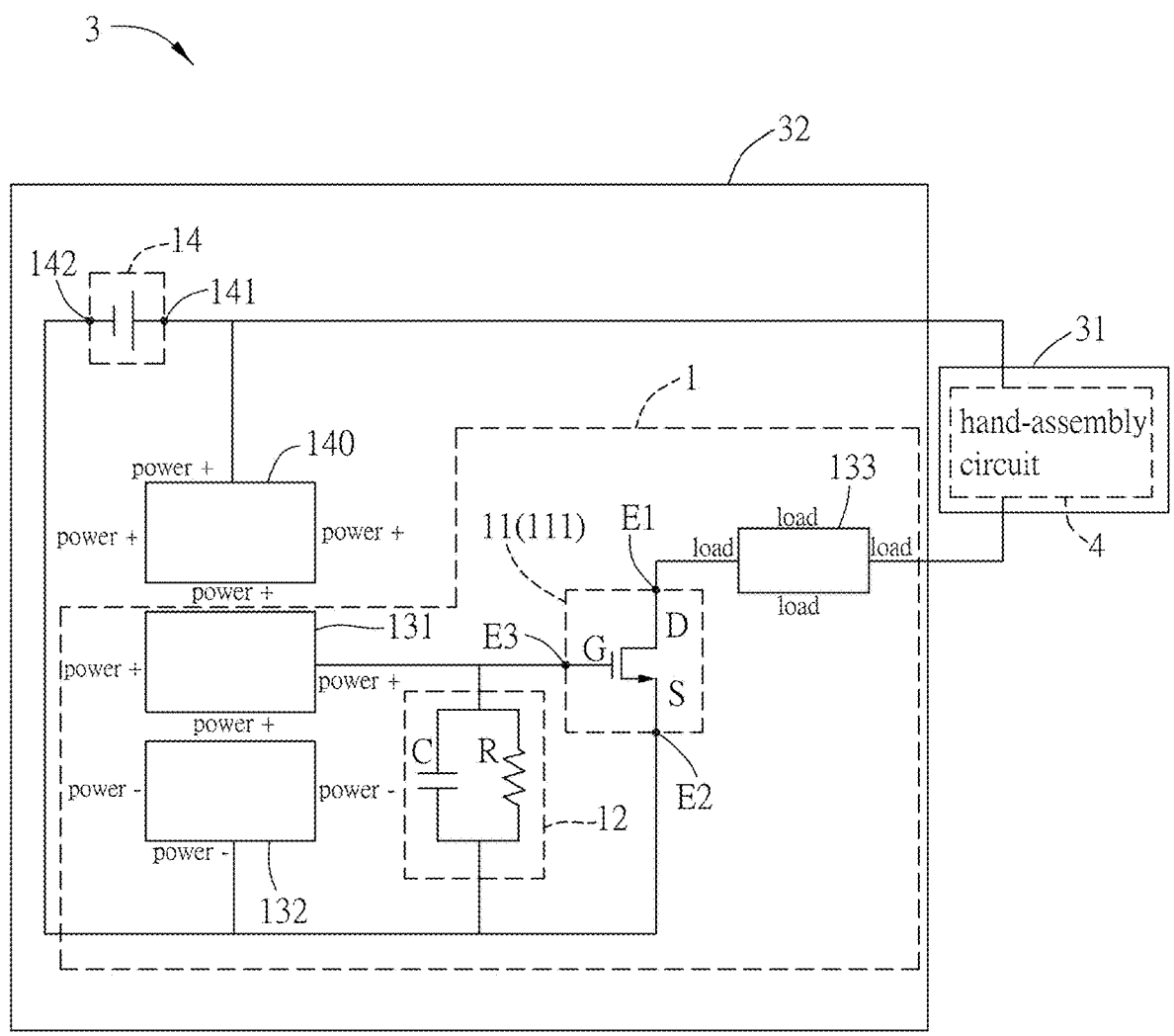
FIGS. 4A to 4D are schematic diagrams showing the hand-assembly circuit boards according to different embodiments of this disclosure.

As shown in FIG. 4A, the hand-assembly circuit board 3 of this embodiment comprises the above-mentioned load control device 1 with an open switch and a hand-assembly circuit 4. The hand-assembly circuit 4 is electrically connected to the load control device 1. In this embodiment, the hand-assembly circuit 4 comprises a load unit. The hand-assembly circuit 4 is electrically connected to the positive electrode 141 of the power source unit 14 and electrically connected to the first electrode E1 (drain D) of the transistor 111 via the third hand-assembly electrode 133. The load control device 1 can provide power for driving the hand-assembly circuit 4 (load unit) to operate, thereby controlling the hand-assembly circuit 4. For example, the hand-assembly circuit 4 can be controlled to output sound and/or light, to generate heat, to change color, to generate electromagnetic field, or any combination thereof. The hand-assembly circuit 4 comprises the circuit in the base of hand assembling, which can be manufactured by a process different from the conventional printed circuit. In other words, the manufacturing process of the hand-assembly circuit 4 does not need to prepare the draft circuit layout, and the plural steps for transferring the draft circuit layout to the substrate by photoresist or printing. The characteristics of the hand-assembly circuit 4 is that the user can arrange the circuit to make it work according to the guidance of the circuit manufacturing guideline, so as to reduce the difficulty of manufacturing the circuit and make the user intuitively and easily operate it, increase the flexibility of manufacturing the circuit, and improve the pleasure of DIY the circuit. In addition, the internal components of the hand-assembly circuit 4 are not electrically connected by soldering, but are electrically connected by means such as conductive ink (e.g. ink containing silver adhesive, silver nanoparticles), conductive adhesive, conductive tape, or conductive paper. In addition, the hand-assembly circuit 4 can also be electrically connected to the load control device 1 through conductive ink, conductive adhesive, conductive tape, or conductive paper.

In this embodiment, the hand-assembly circuit board further comprises two substrates 31 and 32. The hand-assembly circuit 4 is disposed on the substrate 31, and the load control device 1 is disposed on the other substrate 32. The substrates 31 and 32 can be made of the same material or different materials. In this embodiment, the substrates 31 and 32 are made of different materials. The substrate 32 can be a common printed circuit board, and the substrate 31 can be made of the material such as a wood substrate, a bamboo substrate, a paper substrate, a cotton substrate, a high-density fiber substrate, a resin substrate, or any combination thereof. Herein, the substrate 31 is mainly an insulating substrate. In this embodiment, the material of the substrate 31 is not selected from the common substrate material used to manufacture the printed circuit board, such as aluminum substrate, iron substrate, phenol copper clad laminate, epoxy copper clade laminate, glass-epoxy copper laminate, glass composite clad laminate, glass epoxy or glass benzene resin substrate, and the likes.

Figure 4B:
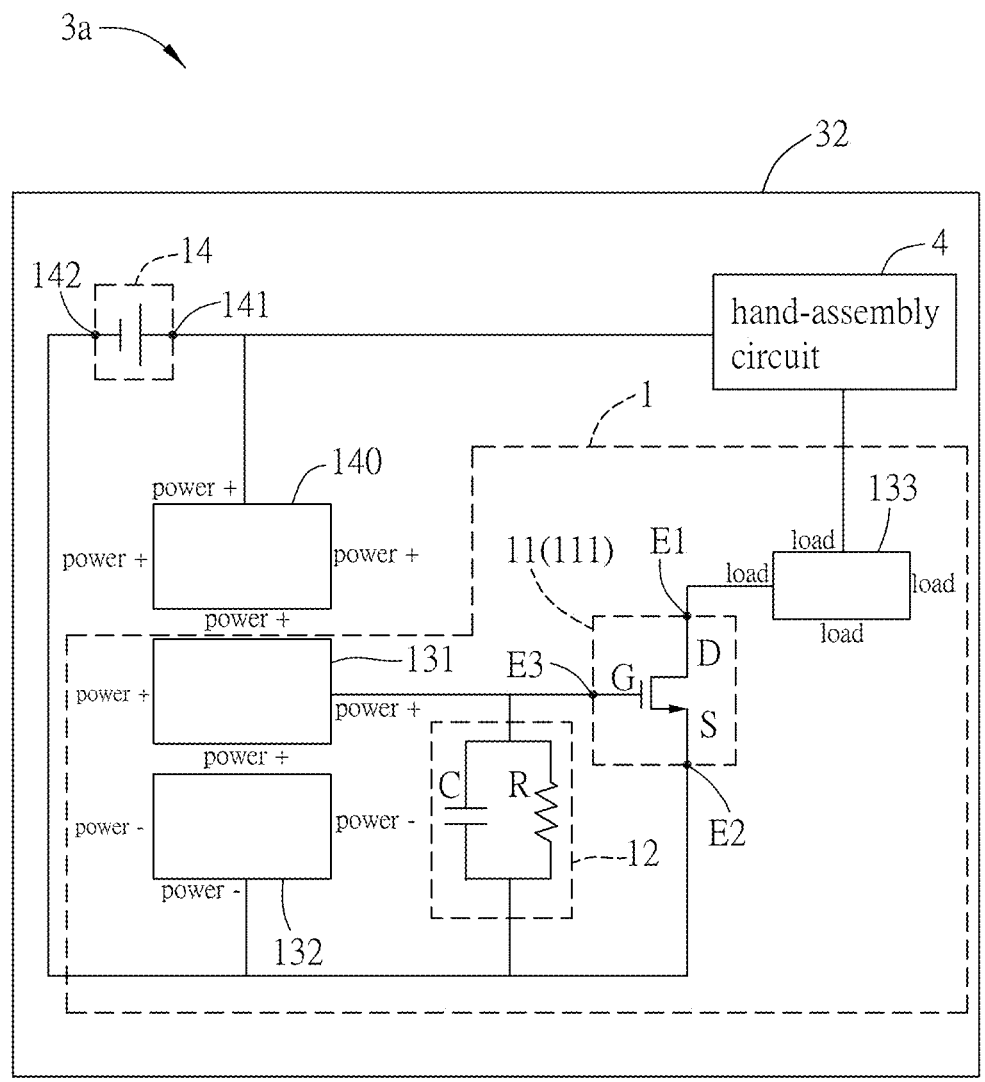
Figure 4C:
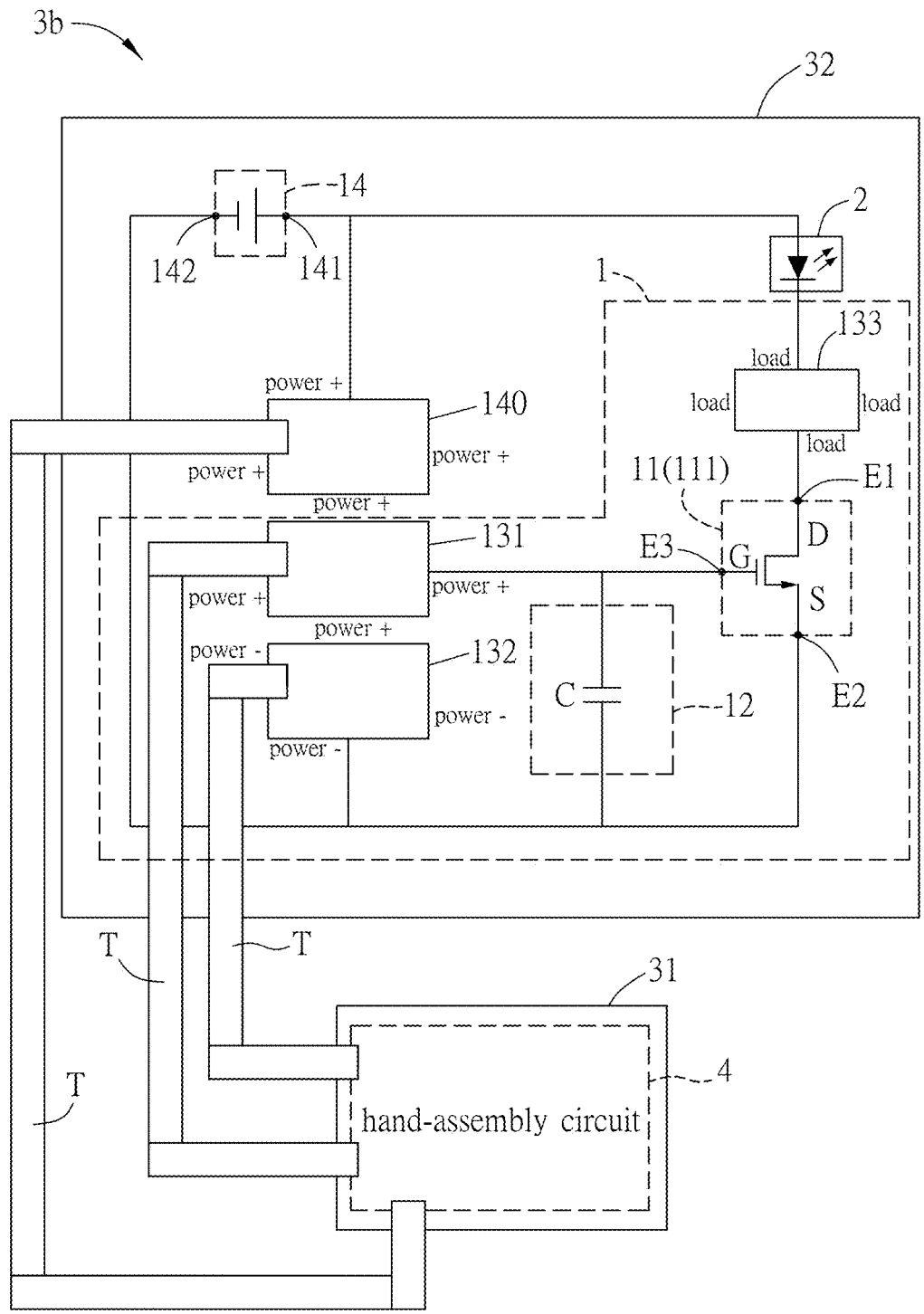

As shown in FIG. 4B, the component configurations and connections of the hand-assembly circuit board 3a of this embodiment are mostly the same as those of the hand-assembly circuit board 3 of the previous embodiment. Different from the hand-assembly circuit board 3, the hand-assembly circuit board 3a only comprises a substrate 32, and the load control device 1 and the hand-assembly circuit 4 are both disposed on the substrate 32. Of course, the hand-assembly circuit board may comprise the substrate 31 only, and the load control device 1 and the hand-assembly circuit 4 are both disposed on the substrate 31. This disclosure is not limited.

As shown in FIG. 4C, the component configurations and connections of the hand-assembly circuit board 3b of this embodiment are mostly the same as those of the hand-assembly circuit board 3 of the previous embodiment. Different from the hand-assembly circuit board 3, the load control device 1 of the hand-assembly circuit board 3b is electrically connected to the first hand-assembly electrode 131, the second hand-assembly electrode 132 and the fourth hand-assembly electrode 140. In addition, the charge/charge-discharge circuit of the load control device 1 of this embodiment is a charge circuit 12, which comprises a capacitor C only. Accordingly, when the first hand-assembly electrode 131 and the fourth hand-assembly electrode 140 are conducted or when the first hand-assembly electrode 131 and the second hand-assembly electrode 132 are conducted, the capacitor C of the charge circuit 12 of the load unit 2 can be controlled to be charged or discharged, and the operation of the hand-assembly circuit 4 can also be controlled.

To be noted, since the hand-assembly circuit 4 can be electrically connected to the load control device 1 through conductive ink, conductive adhesive, conductive tape, or conductive paper, in the embodiment of FIG. 4C, the hand-assembly circuit 4 is electrically connected to the first hand-assembly electrode 131, the second hand-assembly electrode 132 and the fourth hand-assembly electrode 140 of the load control device 1 through the conductive tape T, thereby simultaneously controlling the operation of the hand-assembly circuit 4 through the conductive tape T as well as the first hand-assembly electrode 131 and the fourth hand-assembly electrode 140, or the first hand-assembly electrode 131 and the second hand-assembly electrode 132. In this embodiment, since the surface area of the first hand-assembly electrode 131, and/or the second hand-assembly electrode 132, and the fourth hand-assembly electrode 140 is greater than or equal to 15 mm$^2$, the user can easily attach the hand conductive tapes T on the surface of the first hand-assembly electrode 131, the second hand-assembly electrode 132, and the fourth hand-assembly electrode 140. In this case, the contact area between the conductive tape and the hand-assembly electrode(s) is larger, so the conductivity can be sufficiently increased. Of course, in other embodiments, the hand-assembly circuit 4 can be electrically connected to the load control device 1 through the conductive ink, conductive adhesive, or conductive paper.

Each of the hand-assembly circuit boards 3, 3a and 3b of the embodiments as shown in FIGS. 4A to 4C comprises, for example, the load control device 1, but this disclosure is not limited thereto. In different embodiments, the hand-assembly circuit board may comprise the above-mentioned load control device 1a or any modification thereof, and this disclosure is not limited.

Figure 4D:
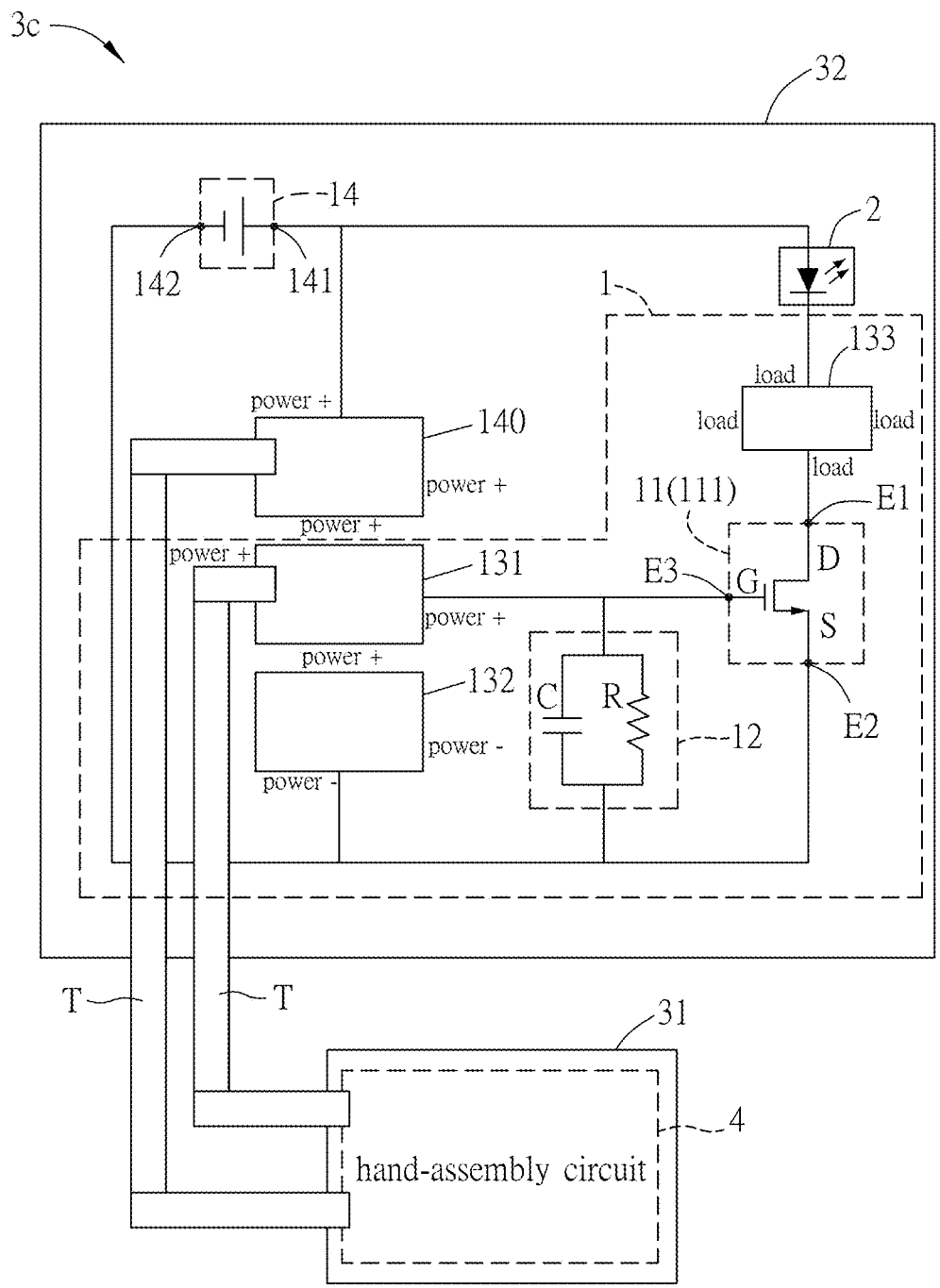

In addition, as shown in FIG. 4D, the component configurations and connections of the hand-assembly circuit board 3c of this embodiment are mostly the same as those of the hand-assembly circuit board 3b of the previous embodiment. Different from the hand-assembly circuit board 3b, the charge/charge-discharge circuit of the load control device of this embodiment is a charge-discharge circuit 12, which comprises a capacitor C and a resistor R. In addition, the hand-assembly circuit 4 of this embodiment is electrically connected to the first hand-assembly electrode 131 and the fourth hand-assembly electrode 140 of the load control device 1 through the conductive tapes T, thereby simultaneously controlling the operation of the hand-assembly circuit 4 and the charging of the capacitor C through the conductive tapes T.

Based on the above-mentioned application examples and application situations, it is found that the load control device and hand-assembly circuit board of this disclosure have the advantages of simple circuit, easy manufacturing, low cost, and wide application field. In addition, the load control device and hand-assembly circuit board of this disclosure can derive various operation modes base on the conductivity (resistance value) of the medium for conducting the open switch.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A hand-assembly circuit board, which is suitable for conduction by an external object or an external medium, comprising:
   a load control device, comprising:
      a transistor circuit comprising a transistor,
      a charge/charge-discharge circuit electrically connected to a control electrode and a second electrode of the transistor,
      a first hand-assembly electrode electrically connected to the control electrode of the transistor;
      a second hand-assembly electrode electrically connected to the charge/charge-discharge circuit and the second electrode of the transistor; and
      a third hand-assembly electrode;
   a hand-assembly circuit electrically connected to the load control device; and
   a fourth hand-assembly electrode,
   wherein the first hand-assembly electrode, the second hand-assembly electrode and the fourth hand-assembly electrode form an open switch, the open switch is conducted by the external object or the external medium.

2. The hand-assembly circuit board of claim 1, wherein a surface area of the first hand-assembly electrode and/or the second hand-assembly electrode is greater than or equal to 15 mm$^2$.

3. The hand-assembly circuit board of claim 1, wherein the hand-assembly circuit comprises a load unit, and one end of the load unit is electrically connected to a first electrode of the transistor through the third hand-assembly electrode.

4. The hand-assembly circuit board of claim 3, wherein the load control device further comprises a power source unit, the fourth hand-assembly electrode is disposed adjacent to the first hand-assembly electrode, a positive electrode of the power source unit is electrically connected to the fourth hand-assembly electrode and another end of the load unit, and a negative electrode of the power source unit is electrically connected to the second hand-assembly electrode.

5. The hand-assembly circuit board of claim 4, wherein a plurality of marks are disposed around the first hand-assembly electrode, the second hand-assembly electrode, the third hand-assembly electrode, or the fourth hand-assembly electrode.

6. The hand-assembly circuit board of claim 3, wherein the fourth hand-assembly electrode is disposed adjacent to the first hand-assembly electrode, the fourth hand-assembly electrode is electrically connected to a positive electrode of a power source unit, and the second hand-assembly electrode is electrically connected to a negative electrode of the power source unit.

7. The hand-assembly circuit board of claim 6, wherein a plurality of marks are disposed around the first hand-assembly electrode, the second hand-assembly electrode, the third hand-assembly electrode, or the fourth hand-assembly electrode.

8. The hand-assembly circuit board of claim 1, further comprising:
   a substrate, wherein the hand-assembly circuit is disposed on the substrate.

9. The hand-assembly circuit board of claim 8, wherein the load control device is disposed on the substrate.

10. The hand-assembly circuit board of claim 1, wherein the hand-assembly circuit is electrically connected to the load control device through a conductive ink, a conductive adhesive, a conductive tape, or a conductive paper.

11. A load control device cooperated with a fourth hand-assembly electrode, the load control device is suitable for conduction by an external object or an external medium to control a load unit, comprising:
   a transistor circuit comprising a transistor, wherein a first electrode of the transistor is electrically connected to one end of the load unit;
   a charge/charge-discharge circuit electrically connected to a control electrode and a second electrode of the transistor;
   a first hand-assembly electrode electrically connected to the control electrode of the transistor;
   a second hand-assembly electrode electrically connected to the charge/charge-discharge circuit and the second electrode of the transistor; and
   a third hand-assembly electrode,
   wherein the first hand-assembly electrode, the second hand-assembly electrode and the fourth hand-assembly electrode form an open switch, the open switch is conducted by the external object or the external medium.

12. The load control device of claim 11, wherein a surface area of the first hand-assembly electrode and/or the second hand-assembly electrode is greater than or equal to 15 mm$^2$.

13. The load control device of claim 11, wherein the first electrode of the transistor is electrically connected to the load unit through the third hand-assembly electrode.

14. The load control device of claim 13, wherein the first hand-assembly electrode, the second hand-assembly electrode or the third hand-assembly electrode is a flat conductive body or a 3D conductive body.

15. The load control device of claim 13, further comprising:
   the fourth hand-assembly electrode disposed adjacent to the first hand-assembly electrode; and
   a power source unit, wherein a positive electrode of the power source unit is electrically connected to the fourth hand-assembly electrode and another end of the load unit, and a negative electrode of the power source unit is electrically connected to the second hand-assembly electrode.

16. The load control device of claim 15, wherein the fourth hand-assembly electrode is a flat conductive body or a 3D conductive body.

17. The load control device of claim 13, wherein the fourth hand-assembly electrode is disposed adjacent to the first hand-assembly electrode, the fourth hand-assembly electrode is electrically connected to a positive electrode of a power source unit, and the second hand-assembly electrode is electrically connected to a negative electrode of the power source unit.

18. The load control device of claim 17, wherein the fourth hand-assembly electrode is a flat conductive body or a 3D conductive body.

19. The load control device of claim 11, wherein the charge/charge-discharge circuit is a charge circuit comprising a capacitor.

20. The load control device of claim 11, wherein the charge/charge-discharge circuit is a charge-discharge circuit comprising a capacitor and a resistor, which are connected in parallel.

* * * * *